(12) United States Patent
Kadotani et al.

(10) Patent No.: US 7,763,905 B2
(45) Date of Patent: Jul. 27, 2010

(54) SEMICONDUCTOR LIGHT-EMITTING DEVICE

(75) Inventors: Norikazu Kadotani, Hachiouji (JP); Atsushi Nishida, Mitaka (JP); Koichi Fukasawa, Kofu (JP); Hirohiko Ishii, Minamitsuru-gun (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 196 days.

(21) Appl. No.: 12/016,620

(22) Filed: Jan. 18, 2008

(65) Prior Publication Data
US 2008/0179617 A1  Jul. 31, 2008

(30) Foreign Application Priority Data
Jan. 18, 2007  (JP) .............................. 2007-008711

(51) Int. Cl.
*H01L 33/00* (2010.01)
(52) U.S. Cl. .............................. 257/98; 257/81; 257/99; 257/432; 257/E33.059; 257/E33.072; 438/22; 438/47; 438/48
(58) Field of Classification Search ................... 257/81, 257/99, 432, E33.059, E33.072; 438/22, 438/47, 48
See application file for complete search history.

(56) References Cited

U.S. PATENT DOCUMENTS

| 6,774,401 B2 * | 8/2004 | Nakada et al. ................. 257/82 |
| 7,479,662 B2 * | 1/2009 | Soules et al. .................. 257/98 |
| 2004/0089898 A1 * | 5/2004 | Ruhnau et al. ............. 257/343 |

FOREIGN PATENT DOCUMENTS

JP        2005277227 A1   10/2005

\* cited by examiner

*Primary Examiner*—Dao H Nguyen
(74) *Attorney, Agent, or Firm*—Browdy and Neimark, PLLC

(57) ABSTRACT

A semiconductor light-emitting device includes: a printed-wiring board; a light-emitting diode element mounted on the printed-wiring board; and a resin body for sealing the light-emitting diode element. The resin body is composed of a first resin body arranged around the light-emitting diode element, and a second resin body, which seals the light-emitting diode and the first resin body. An upper edge of the first resin body disposed at a lower position of the PN-junction is configured to be at least on or beyond an imaginary line that connects the PN-junction and a lower edge of the second resin body.

9 Claims, 5 Drawing Sheets

SEMICONDUCTOR LIGHT-EMITTING DEVICE

CROSS-REFERENCE TO THE RELATED APPLICATION

This application is based on and claims priority from Japanese Patent Application No. 2007-8711, filed on Jan. 18, 2007, the disclosure of which is incorporated herein by reference in its entirety.

BACKGROUND OF THE INVENTION

1. Field of the Invention

The present invention relates to a semiconductor light-emitting device using a light-emitting diode element.

2. Description of Related Art

Conventionally, in semiconductor light-emitting devices of surface mount type, it has been significant challenges to improve emission efficiency for the sake of extended battery life of intended apparatuses, as well as to achieve a further miniaturization. For improved emission efficiency, some devices are configured so that the periphery of light-emitting diode (hereinafter, abbreviated as LED) element, excluding its light-emitting surface, is covered with a white resin which has a high light reflectance and diffuse reflection effect. (For example, see Japanese Patent Application Laid-Open No. 2005-277227).

On the other hand, conventional light-emitting devices have left room for improvement regarding the effective use of light that is laterally and downwards emitted from a junction of the LED element.

In order to efficiently use light that is emitted from LED element downwards, many semiconductor light-emitting devices have a printed-wiring board that is plated with silver or the like to increase reflectance at the component side for the LED element to be mounted on. Since the LED element emits light radially from its junction, it is difficult to use downward light emitted from its junction efficiently unless the silver plating has a sufficient area. This has left a problem of miniaturization.

FIG. 8 shows a conventional semiconductor light-emitting device 70 which incorporates an LED element 60. The reference numeral 71 represents a printed-wiring board on which the LED element 60 is mounted. A pair of substrate electrodes 72 and 73 is formed on the top of this printed-wiring board 71 so as to wrap around both sides. A reflective film 74 made of metal with a high light reflectance, such as aluminum and silver, is formed on the surface of one substrate electrode 73. Moreover, two element electrodes 54 and 55 of the LED element 60 are connected to the substrate electrodes 72 and 73 of the printed-wiring board 71 by wires 75, respectively. The LED element 60 is sealed with a transparent or translucent resin body 76. The outer periphery except a surface contact with an upper surface of the printed-wiring board of this resin body 76 is configured to be light-emitting surfaces 77.

In the LED element 60, its PN-junction 53 emits light of high intensity radially. Of the light emitted, emission light 78 that travels downward at steep angles from the PN-junction 53 is reflected by the reflective film 74, and is thus directed upward with relatively high efficiency. Emission light 79 that travels slightly downwards from the PN-junction 53 is reflected by the substrate electrode 73 outside the reflective film 74. Also, light emitted laterally and downwards without being reflected, refracts in further downward directions when being emitted out of the resin body 76, and thus, the intensity of light emitted out of the light-emitting device 70 has room for improvement.

In view of bondability of the wires 75, it is desirable to plate the surfaces of the substrate electrodes 72 and 73 with gold. The gold plating, however, has the problem of extremely low reflectance particularly for blue LEDs. As mentioned above, since the PN-junction 53 emits light of high intensity also downward, there has been a significant problem with emission efficiency in that much of light travels laterally downward like the emission light 79.

FIG. 9 shows a semiconductor light-emitting device for solving the foregoing problem, in which reflective films 74a and 74b are provided on the entire surfaces of the substrate electrodes 72 and 73 formed on the printed-wiring board 71. Since the reflective films 74a and 74b are provided on the entire surfaces of the substrate electrodes 72 and 73, both the emission light beams 78 and 79 are reflected by the reflective films 74a and 74b, thereby solving the problem of emission efficiency. However, provision of reflective films 74a and 74b such as aluminum and silver on the wire bonding surfaces can lower wire bondability and deteriorate reliability.

FIG. 10 shows a semiconductor light-emitting device 90 for solving the problem in the reliability of the wire bonding, wherein the width of the semiconductor light-emitting device 90 is increased to widen the reflective film 74. More specifically, the semiconductor light-emitting device 90 shown in FIG. 10 is given a width L2 greater than the width L1 of the semiconductor light-emitting device 70 shown in FIG. 8 (L1<L2). The width of the reflective film 74 is also increased accordingly. This configuration improves emission efficiency and enhances reliability of the wire bonding, whereas it counteracts the miniaturization.

SUMMARY OF THE INVENTION

An object of the present invention is to provide a semiconductor light-emitting device which has a small size but a high emission efficiency.

To achieve the foregoing object, a semiconductor light-emitting device according to the present invention includes: a printed-wiring board; an LED element mounted on the printed-wiring board; and a resin body for sealing the LED element, the resin body being composed of a first resin body arranged around the LED element, and a second resin body for sealing the LED element and the first resin body.

Moreover, the first resin body is given a height slightly lower than the position of a PN-junction of the light-emitting diode element. Also, regarding the first resin body, that has an upper edge configured by a top surface and a side surface, the upper edge of the first resin body is configured to be set at least on an imaginary line that connects the PN-junction of the LED element and a lower edge configured by a side surface and a bottom surface of the second resin body. It is preferable that the edge of the first resin body is set beyond the imaginary line that connects the PN-junction of the LED element and the lower edge of the second resin body.

In addition, the first resin body also has a diffuse reflection effect, with a light reflectance higher than that of the second resin body.

According to the present invention, it is possible to increase reflectance of the light emitted from the LED element, thereby providing a semiconductor light-emitting device which has a small size and a high emission efficiency.

It is also possible to increase the amount of light to be emitted from one LED element. Even in cases where a plurality of LED elements are required, the number of elements in use can thus be reduced to miniaturize the semiconductor light-emitting device for cost saving.

DETAILED DESCRIPTION OF THE PREFERRED EMBODIMENTS

Preferred embodiments of the present invention will be explained in detail below with reference to the accompanying drawings.

Figure 1:
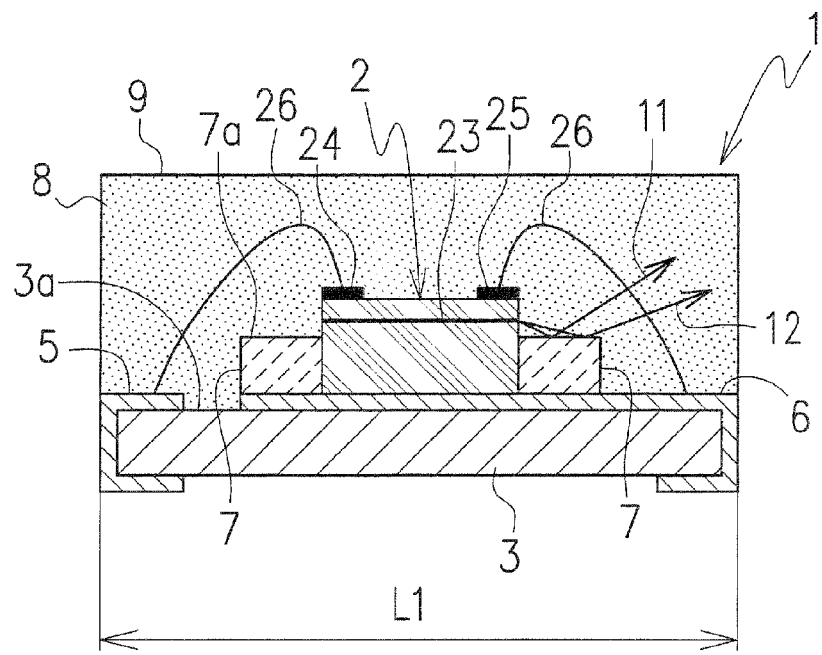
FIG. 1 is a cross-sectional view showing a first embodiment of the semiconductor light-emitting device according to the present invention.

FIG. 1 shows a first embodiment of the semiconductor light-emitting device according to the present invention. The semiconductor light-emitting device 1 includes an LED element 2, a printed-wiring board 3 on which the LED element 2 is mounted, and a resin body for sealing the LED element 2 on the printed-wiring board 3.

A pair of substrate electrodes 5 and 6 is formed on the top surface 3a of the printed-wiring board 3 so as to wrap around both sides. The LED element 2 is bonded to the top surface of one substrate electrode 6 with an adhesive (not shown). Moreover, a pair of element electrodes 24 and 25 of the LED element 2 is electrically connected to the substrate electrodes 5 and 6 by wires 26, respectively.

In the present invention, the resin body is composed of: a first resin body 7 which is arranged to surround the LED element 2 mounted on the printed-wiring board 3; and a second resin body 8 which seals the LED element 2 and the first resin body 7 on the printed-wiring board 3. The second resin body 8 is made of a transparent or translucent epoxy resin or silicone resin. The outer periphery thereof except a surface contact with the printed circuit board 3 is used as light-emitting surfaces 9. It should be noted that a fluorescent agent and the like may be mixed into the second resin body 8. For example, when the LED element 2 is a blue light-emitting diode, a yellow fluorescent agent such as YAG can be mixed into the second resin body 8 so that white light is emitted from the light-emitting surface 9 of the semiconductor light-emitting device 1.

In the present embodiment, the first resin body 7 is given a height lower than the position of the PN-junction 23, which is the light-emitting surface of the LED element 2. It is particularly desirable that the top surface 7a of the first resin body 7 be located slightly lower than the position of the PN-junction as shown in FIG. 1. This configuration makes it possible for the top surface 7a of the first resin body 7 to reflect much of the light that is emitted laterally and downwards from the PN-junction of the LED element 2.

For utilizing light emitted from the LED element toward laterally and downwards as light reflected upward efficiently, the first resin body is preferably located slightly lower than the position of the PN-junction 23 and the top surface of the first resin body is preferably set as large as possible in the second resin body.

Figure 2:
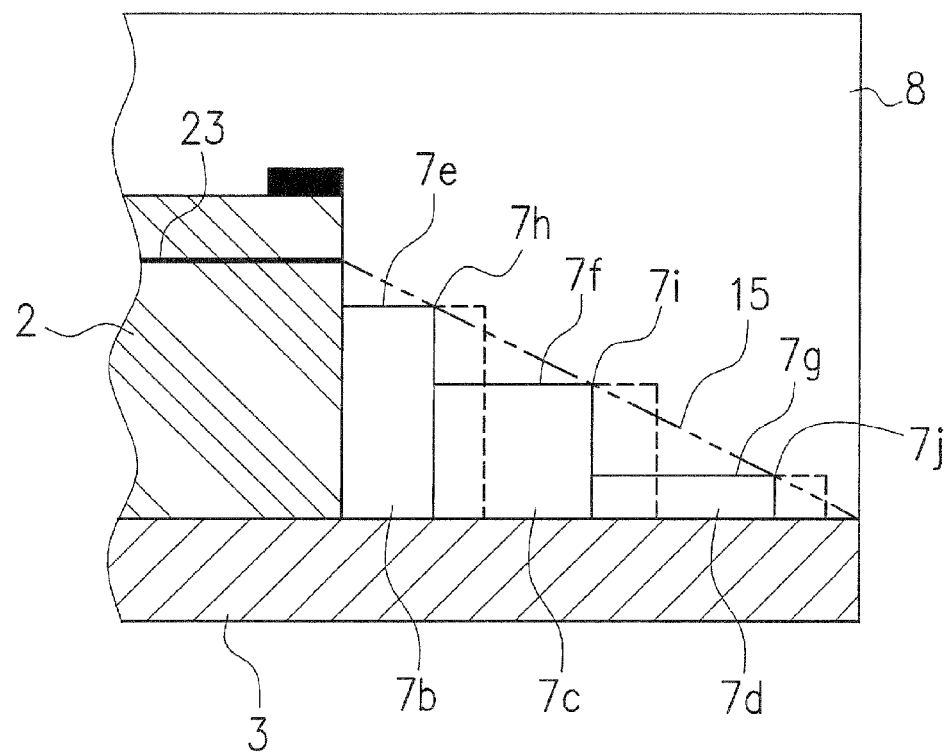
FIG. 2 is an explanatory diagram showing how to determine a lower limit of an upper edge position of the first resin body.

By the way, FIG. 2 shows how to determine a lower limit of height of the first resin body for the sake of utilizing light emitted from the LED element toward laterally and downwards as light reflected upward. FIG. 2 shows three types of the first resin body 7b, 7c, and 7d, each type having a different area of top surface 7e, 7f, or 7g. As a lower limit of each first resin body 7b, 7c, or 7d, an edge 7h, 7i, 7j of the first resin body is at least on an imaginary line 15 or beyond the line 15 connecting the PN-junction 23 of the LED element 2 and a lower edge of the second resin body.

Here, the upper edge 7h, 7i, 7j of the first resin body is an upper edge between the top surface and the side surface of the first resin body, and the lower edge of the second resin body is a lower edge between a side surface and a bottom surface of the second resin body. In this way, it is possible to determine a lower limit of height of the first resin body in relation to an area of the top surface of the first resin body for possibilities of design freedom.

Moreover, in the present invention, the first resin body 7 has a light reflectance higher than that of the second resin body. As a means of increasing the light reflectance, the present invention provides the first resin body 7 with a diffuse reflection effect. Diffuse reflection refers to situations where light from a light source impinges on minute asperities formed on the surface of an object and is diffusely reflected by the same.

The formation of the first resin body 7 from a white resin can increase the diffuse reflection effect. Fillers such as titanium oxide, white ceramics, and surface-roughened aluminum or silver can also be mixed into the transparent or translucent resin to enhance the diffuse reflection effect.

Figure 8:
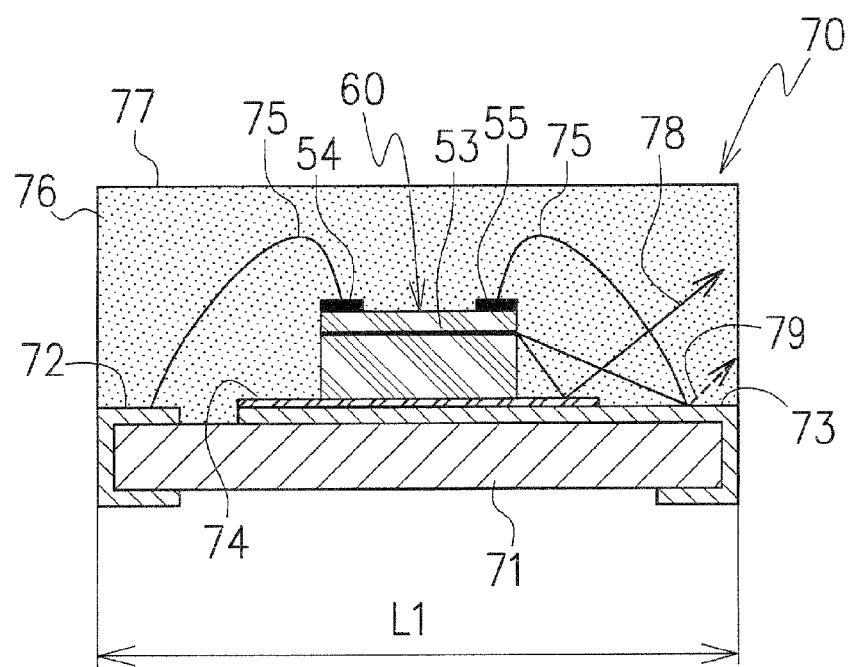
FIG. 8 is a cross-sectional view showing an example of a conventional semiconductor light-emitting device.
Figure 9:
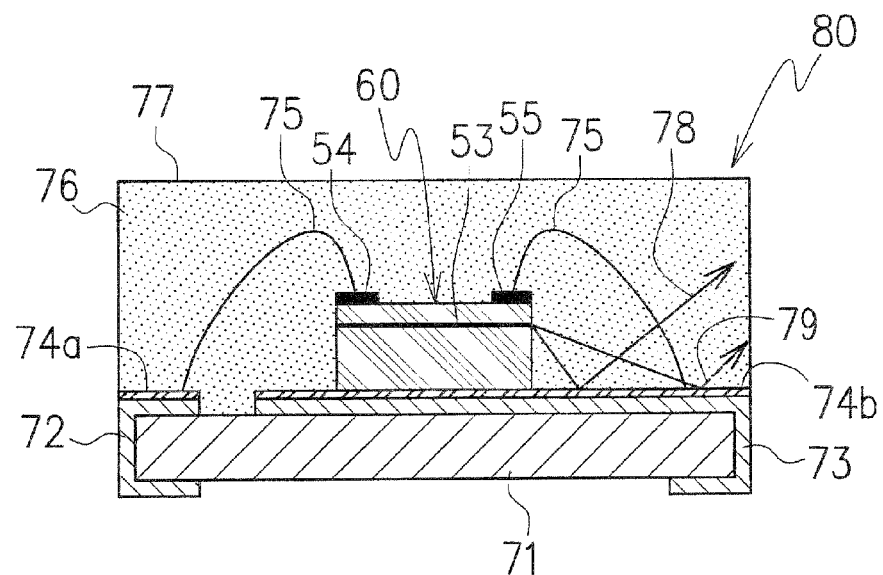
FIG. 9 is a cross-sectional view showing another example of a conventional semiconductor light-emitting device.
Figure 10:
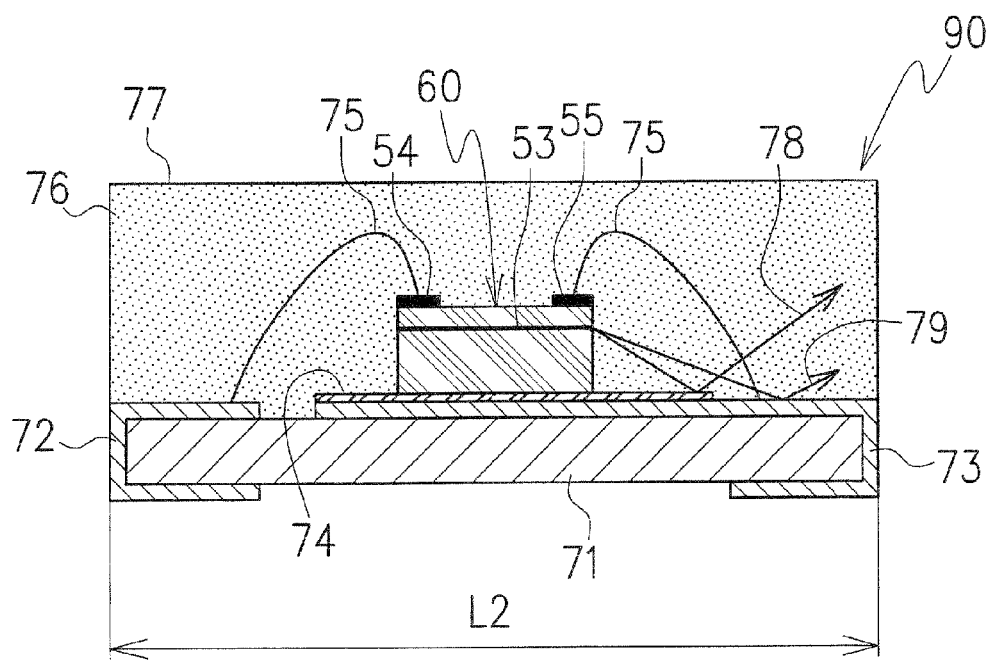
FIG. 10 is a cross-sectional view showing yet another example of a conventional semiconductor light-emitting device.

As described above, the first resin body 7 highly effective in diffuse reflection is arranged close by the PN-junction 23 of the LED element 2. Thus, even if the first resin body 7 has a small area, emission light beams 11 and 12 that travel obliquely downward from the junction 23 can both be reflected by the top 7a of the first resin body 7 toward the light output surface 9 with high efficiency. This configuration can increase the reflectance of the light emitted from the LED element 2, thereby achieving a semiconductor light-emitting device 1 which has a small size but a high emission efficiency. It should be noted that the semiconductor light-emitting device 1 can be confined within the same width L1 as that of the semiconductor light-emitting device 1 shown in FIG. 8.

Figure 3:
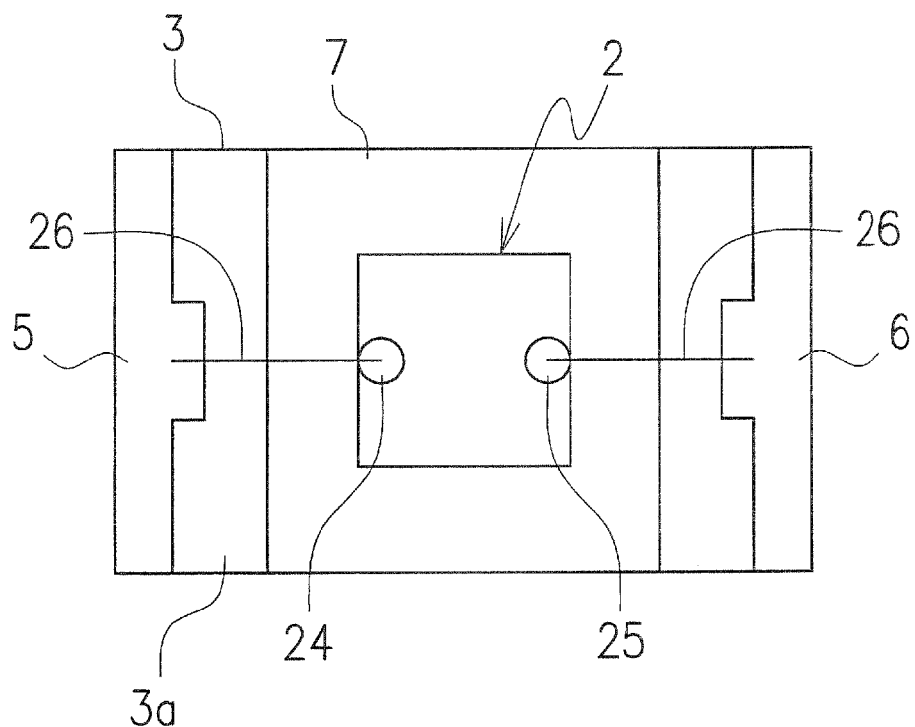
FIG. 3 is a plan view of an embodiment according to the present invention.

Also, as shown in an embodiment in FIG. 3, the LED element may be mounted directly on a top surface 3a of a printed-circuit board 3 and electrically connected to substrate electrodes disposed on the printed-circuit board 3 by wires 26.

Figure 4:
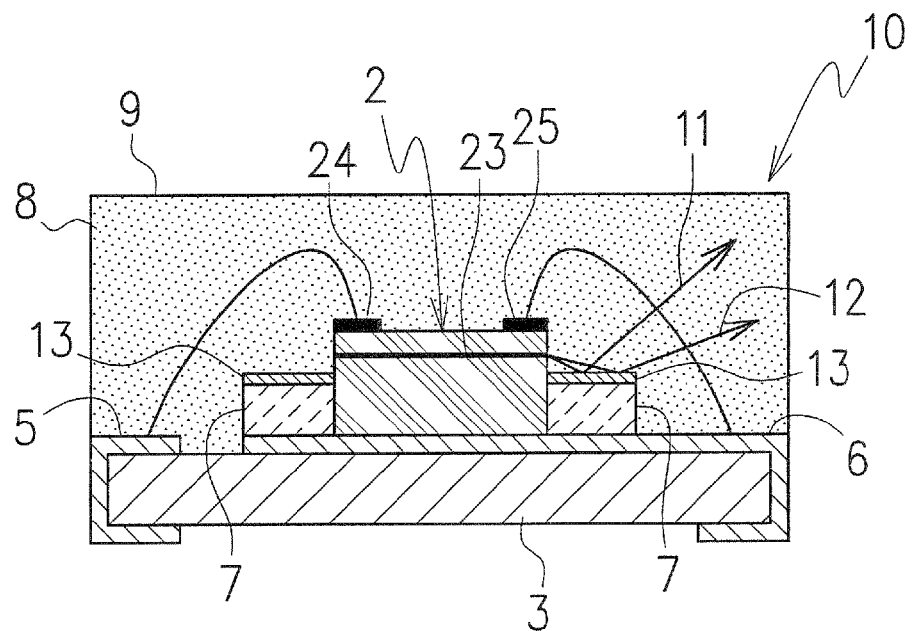
FIG. 4 is a cross-sectional view showing a second embodiment of the semiconductor light-emitting device according to the present invention.

FIG. 4 shows a second embodiment of the semiconductor light-emitting device according to the present invention. The semiconductor light-emitting device 10 has almost the same configuration as that of the semiconductor light-emitting device 1 according to the foregoing first embodiment except that a reflective film 13 highly effective in diffuse reflection is formed on the top of the first resin body 7. Like reference numerals will thus be given, and a detailed description thereof will be omitted. The reflective film 13 mentioned above is made of an evaporated film of metal having a high reflectance such as aluminum and silver. Alternatively, the top of the first resin body 7 may be plated. The plated surface can be roughened to enhance the diffuse reflection effect further.

In this way, when the reflective film 13 is formed on the top of the first resin body 7, the emission light beams 11 and 12 emitted from the PN-junction 23 of the LED element 2 can be diffusely reflected toward the light output surface 9 with high efficiency.

It should be noted that fillers having a high coefficient of thermal conductivity can be mixed into the first resin body 7 to enhance the effect of heat radiation from the LED element 2, the down side being a consequent drop in reflectance of the first resin body 7. Accordingly, the mixing of fillers having a high coefficient of thermal conductivity into the first resin body 7 and the formation of the reflective film 13 on the top thereof can be combined to simultaneously provide both high light-emission efficiency and a high heat radiation effect.

Figure 5:
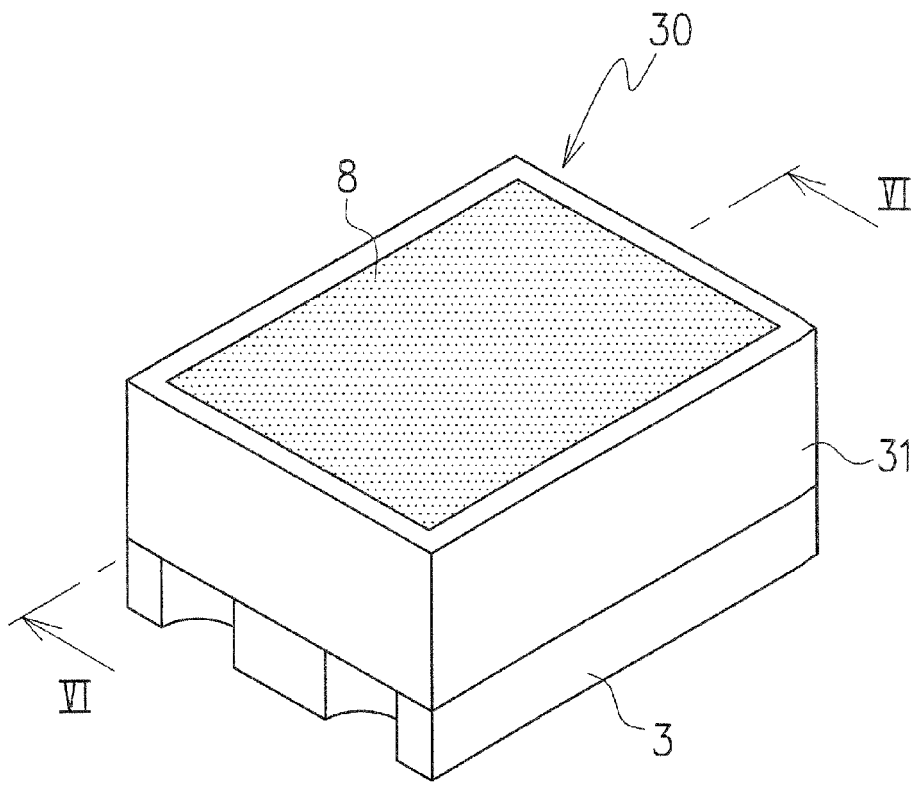
FIG. 5 is a perspective view showing a third embodiment of the semiconductor light-emitting device according to the present invention.
Figure 6:
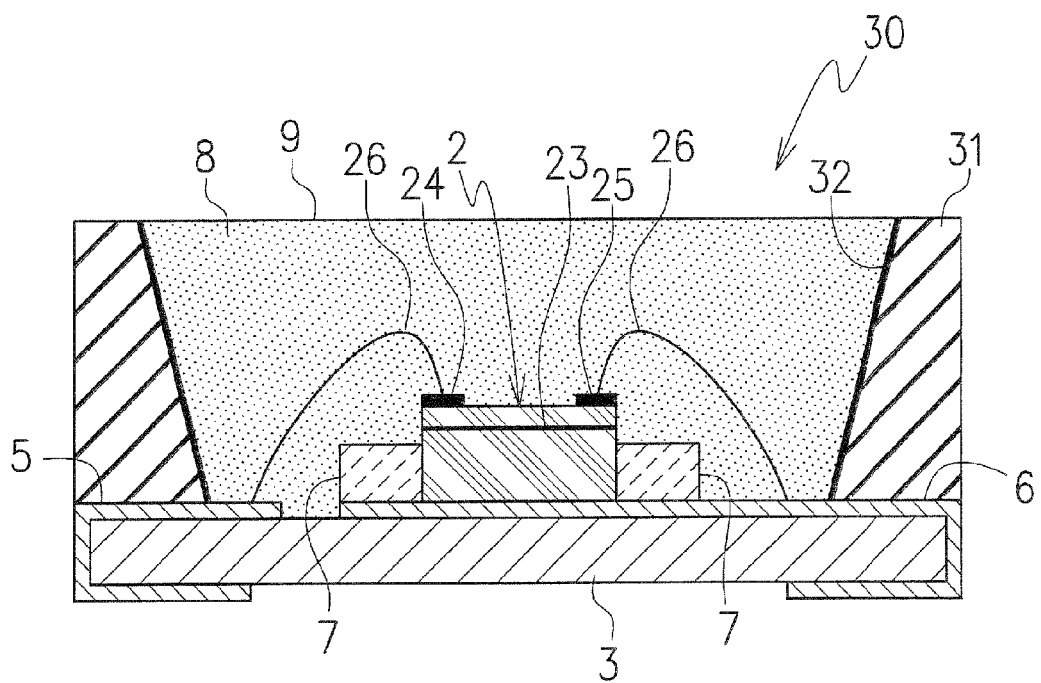
FIG. 6 is a cross-sectional view taken along the line VI-VI of the foregoing FIG. 3.

FIGS. 5 and 6 show a third embodiment of the semiconductor light-emitting device according to the present invention. The semiconductor light-emitting device 30 has almost the same configuration as that of the semiconductor light-emitting device according to the foregoing first embodiment except that side surfaces with a tilt of the second resin body 8 are surrounded by a frame 31. Like reference numerals will thus be given, and a detailed description thereof will be omitted. As shown in FIG. 6, the inner side surfaces 32 of the frame 31 is tilted so as to spread out upward, and is provided with a reflective film or mirror finishing to improve the reflecting efficiency at the surface. This configuration can further enhance the emission efficiency of the light emitted from the LED element 2. It should be noted that the reflective film or the mirror finishing on the inner periphery 32 can be omitted if the frame 31 is made of a material having a relatively high reflectance.

Figure 7:
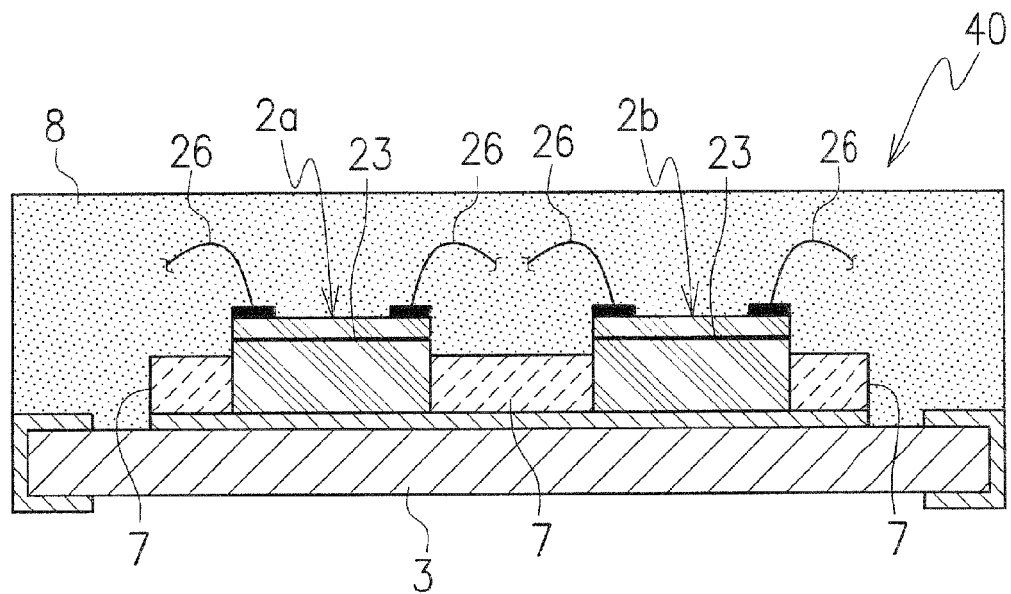
FIG. 7 is a cross-sectional view showing a fourth embodiment of a semiconductor light-emitting device according to the present invention which incorporates a plurality of LED elements.

FIG. 7 shows a fourth embodiment of the semiconductor light-emitting device according to the present invention. The semiconductor light-emitting device 40 deals with the case where a plurality of LED elements is mounted on the printed-wiring board 3. For example, FIG. 5 shows the case where two LED elements 2a and 2b are mounted. In this instance, the first resin body 7 which surrounds the LED elements 2a and 2b is also interposed between the two LED elements 2a and 2b.

This configuration can further enhance the emission efficiency of the semiconductor light-emitting device 40 having a plurality of LED elements 2a and 2b. For example, even if three or more LED elements are mounted on a single substrate of small area in a closely-packed state, it is possible to avoid a drop in emission efficiency and provide a semiconductor light-emitting device which has a high emission efficiency and a small size.

As has been described, according to the present invention, the resin body highly effective in diffuse reflection is arranged close by the PN-junction, so that the light emitted from the PN-junction can be reflected with high efficiency.

The present invention also provides the significant effect that a plurality of LED elements can be closely arranged on a printed-wiring board of small area while avoiding a drop in emission efficiency.

Although the preferred embodiments of the present invention have been mentioned, it should be noted that the present invention is not limited to these embodiments, and various changes and modifications can be made to the embodiments.

What is claimed is:

1. A semiconductor light-emitting device comprising:
   a printed-wiring board;
   a light-emitting diode element mounted on an upper surface of the printed-wiring board, the light-emitting diode element being provided with a PN-junction at a certain position; and
   a resin body for sealing the light-emitting diode element, the resin body being composed of a first resin body having a light reflectance and being arranged on the upper surface of the printed-wiring board around the light-emitting diode element with an upper peripheral portion of the printed-wiring board exposed from the first resin body, and a second resin body sealing the light-emitting diode element, the first resin body, and the upper peripheral portion of the printed-wiring board,
   a level of an upper surface of the first resin body being set lower than a position of the PN-junction, and
   an upper peripheral edge of the first resin body being set at least on or above an imaginary line that connects the PN-junction and an upper peripheral edge of the printed-wiring board.

2. The semiconductor light-emitting device according to claim 1, wherein the light reflectance of the first resin body is higher than that of the second resin body.

3. The semiconductor light-emitting device according to claim 1, wherein the level of the upper surface of the first resin body is slightly lower than the position of the PN-junction.

4. The semiconductor light-emitting device according to claim 1, wherein the first resin body has a diffuse reflection effect.

5. The semiconductor light-emitting device according to claim 4, wherein the first resin body is formed of a white resin or a transparent or translucent resin containing at least one selected from the group consisting of a white ceramic, aluminum, and silver as a filler.

6. The semiconductor light-emitting device according to claim 1, wherein a reflective film is formed at least on top of the first resin body.

7. The semiconductor light-emitting device according to claim 6, wherein the reflective film formed at least on the top of the first resin body is a plating or a thin film of metal having a high reflectance such as aluminum or silver.

8. The semiconductor light-emitting device according to claim 1, wherein a frame is formed around the second resin body.

9. The semiconductor light-emitting device according to claim 1, wherein the first resin body contains a filler having a high coefficient of thermal conductivity.

\* \* \* \* \*